United States Patent
Cho et al.

(10) Patent No.: US 10,886,058 B2
(45) Date of Patent: Jan. 5, 2021

(54) INDUCTOR AND LOW-NOISE AMPLIFIER INCLUDING THE SAME

(71) Applicant: Samsung Electro-Mechanics Co., Ltd., Suwon-si (KR)

(72) Inventors: Hyung Jun Cho, Suwon-si (KR); Jong Mo Lim, Suwon-si (KR); Hyun Hwan Yoo, Suwon-si (KR); Hyun Jin Yoo, Suwon-si (KR); Yoo Hwan Kim, Suwon-si (KR); Yoo Sam Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 25 days.

(21) Appl. No.: 16/520,395

(22) Filed: Jul. 24, 2019

(65) Prior Publication Data

US 2020/0227201 A1 Jul. 16, 2020

(30) Foreign Application Priority Data

Jan. 16, 2019 (KR) .................. 10-2019-0005837

(51) Int. Cl.
*H03F 1/22* (2006.01)
*H01F 27/28* (2006.01)
*H03F 1/56* (2006.01)
*H03F 3/04* (2006.01)

(52) U.S. Cl.
CPC ......... *H01F 27/2804* (2013.01); *H03F 1/565* (2013.01); *H03F 3/04* (2013.01); *H01F 2027/2809* (2013.01); *H03F 2200/222* (2013.01); *H03F 2200/294* (2013.01)

(58) Field of Classification Search
CPC .............. H03F 1/22; H01F 5/00; H01F 17/00
USPC ........................................... 330/311
See application file for complete search history.

(56) References Cited

U.S. PATENT DOCUMENTS

| 7,978,043 | B2* | 7/2011 | Nabeshima | H01Q 7/00 336/200 |
| 9,177,709 | B2* | 11/2015 | Parthasarathy | H01F 17/0013 |
| 10,536,121 | B2* | 1/2020 | Lee | H03F 3/72 |
| 2015/0364248 | A1 | 12/2015 | Groves | |
| 2017/0365389 | A1 | 12/2017 | Yosui et al. | |

FOREIGN PATENT DOCUMENTS

| JP | 8-162803 A | 6/1996 |
| KR | 10-0807132 B1 | 3/2008 |
| WO | WO 2005/034239 A2 | 4/2005 |

(Continued)

OTHER PUBLICATIONS

Korean Office Action dated Oct. 30, 2019 in counterpart Korean Patent Application No. 10-2019-0005837 (7 pages in English and 5 pages in Korean).

(Continued)

*Primary Examiner* — Henry Choe
(74) *Attorney, Agent, or Firm* — NSIP Law

(57) ABSTRACT

An inductor includes a substrate, and a first coil pattern disposed on one surface of the substrate and having a spiral shape comprising a plurality of turns, wherein as the first coil pattern extends inwardly towards a center of the first coil pattern, a pattern width of the first coil pattern decreases while a center-to-center distance between two adjacent turns of the first coil pattern increases.

10 Claims, 4 Drawing Sheets

P1 < P2 < P3

(56) References Cited

FOREIGN PATENT DOCUMENTS

WO     WO 2014/130065 A1     8/2014
WO     WO 2016/199516 A1     12/2016

OTHER PUBLICATIONS

Kuhn, William B. et al., "Analysis of Current Crowding Effects in Multiturn Spiral Inductors", *IEEE Transactions on Microwave Theory and Techniques*, vol. 49, No. 1, Jan. 2001 (pp. 31-38).
Vanukuru, Venkata Narayana Rao et al., "High-Q Characteristics of Variable Width Inductors With Reverse Excitation", *IEEE Transactions on Electron Devices*, vol. 61, No. 9, Sep. 2014 (pp. 3350-3354).

* cited by examiner

P1 < P2 < P3

P1 = P2 = P3

P1 > P2 > P3

INDUCTOR AND LOW-NOISE AMPLIFIER INCLUDING THE SAME

CROSS-REFERENCE TO RELATED APPLICATIONS

This application claims the benefit under 35 USC 119(a) of Korean Patent Application No. 10-2019-0005837 filed on Jan. 16, 2019, in the Korean Intellectual Property Office, the entire disclosure of which is incorporated herein by reference for all purposes.

BACKGROUND

1. Field

This application relates to an inductor and a low-noise amplifier including the inductor.

2. Description of Related Art

An inductor is a common element in electric and electronic circuits. A quality factor, which is one of the characteristics of an inductor, has a great effect on performance in circuits such as a low-noise amplifier (LNA), a mixer, and a voltage-controlled oscillator (VCO). For example, to improve a noise figure (NF) of a low-noise amplifier, the quality factor of an inductor used for input matching must be increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an inductor includes a substrate; and a first coil pattern disposed on one surface of the substrate and having a spiral shape including a plurality of turns, wherein as the first coil pattern extends inwardly towards a center of the first coil pattern, a pattern width of the first coil pattern decreases while a center-to-center distance between two adjacent turns of the first coil pattern increases.

The inductor may be a thin-film inductor configured for input matching in an integrated circuit.

The inductor may further include a first connection pattern electrically connecting an external end of the first coil pattern to a first external terminal; and a second connection pattern electrically connecting an internal end of the first coil pattern to a second external terminal.

The inductor may further include a second coil pattern formed on another surface of the substrate.

The second coil pattern may have a spiral shape including a plurality of turns, and as the second coil pattern extends inwardly towards a center of the second coil pattern, a pattern width of the second coil pattern may decrease while a center-to-center distance between two adjacent turns of the second coil pattern may increase.

The first coil pattern and the second coil pattern may be connected to each other in series.

The first coil pattern and the second coil pattern may be connected to each other in parallel.

The inductor may further include a first via passing through the substrate; a second via passing through the substrate; a first connection pattern disposed on the one surface of the substrate; and a second connection pattern disposed on the other surface of the substrate, wherein an external end of the first coil pattern and an external end of the second coil pattern may be electrically connected to each other through the first via, an internal end of the first coil pattern and an internal end of the second coil pattern may be electrically connected to each other through the second via, the external end of the first coil pattern may be electrically connected to a first external terminal through the first connection pattern, and the internal end of the second coil pattern may be electrically connected to a second external terminal through the second connection pattern.

Turns of the second coil pattern may terminate adjacent to the second connection pattern on opposite sides of the second connection pattern, and the inductor may further include vias extending through the substrate and connecting respective ends of the turns of the second coil pattern on opposite sides of the second connection pattern to corresponding turns of the first coil pattern so that the ends of the turns of the second coil pattern on opposite sides of the second connection pattern are electrically connected to each other through respective ones of the vias and the corresponding turns of the first coil pattern.

In another general aspect, a low-noise amplifier includes a matching inductor including a coil pattern, wherein one end of the matching inductor is connected to an input terminal, and as the coil pattern extends inwardly towards a center of the coil pattern, a pattern width of the coil pattern decreases while a center-to-center distance between two adjacent turns of the coil pattern increases; and an amplifier circuit configured to amplify an input signal output from another end of the matching inductor and output the amplified input signal to an output terminal.

The low-noise amplifier may be implemented as a single integrated circuit including the matching inductor and the amplifier circuit.

The amplifier circuit may include a potentiometer connected between the matching inductor and a first node; a first capacitor having one end connected to the first node; a first resistor connected between another end of the first capacitor and a first bias terminal; an amplifier configured to amplify a signal output from the other end of the first capacitor and output the amplified signal to a second node; a first inductor connected between the amplifier and a ground; a second inductor connected between a power supply voltage terminal and the second node; a second capacitor connected between the second node and the output terminal; and a third capacitor connected between the output terminal and the ground.

The amplifier circuit may further include a bypass switch connected between the first node and the second node.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
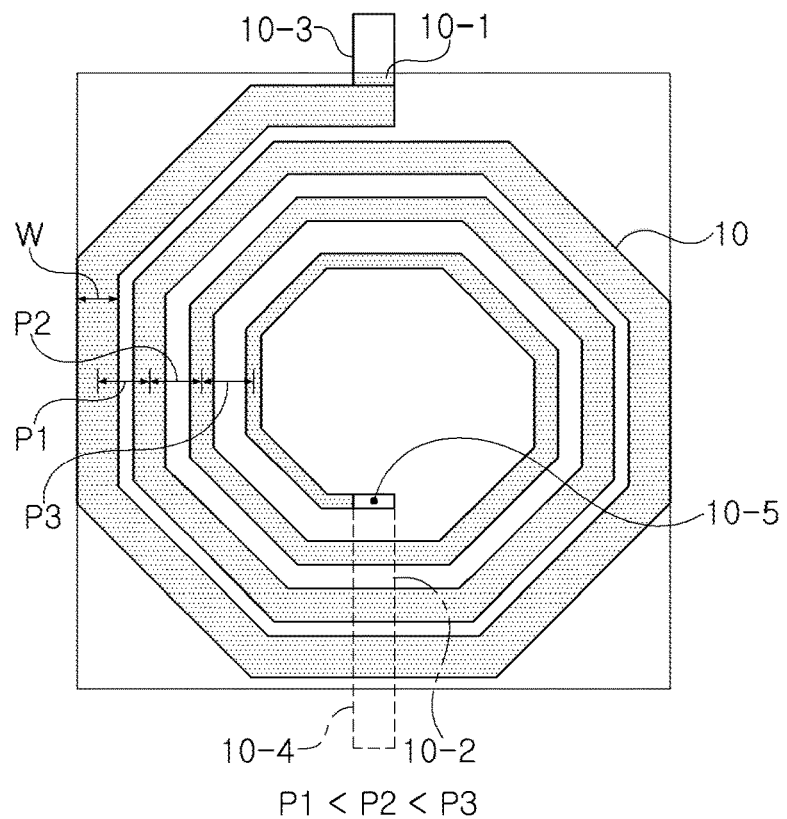
FIG. 1 is a schematic plan view illustrating an example of an inductor.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

FIG. 1 is a schematic plan view of an example of an inductor.

Referring to FIG. 1, an inductor includes a coil pattern 10 having a spiral shape including a plurality of turns.

As the coil pattern 10 of the inductor extends inwardly towards a center of the coil pattern 10, a pattern width W of the coil pattern 10 decreases while a center-to-center distance (P1, P2, P3) between two adjacent turns of the coil pattern 10 increases (that is, P1<P2<P3). For convenience of illustration, P1, P2, and P3 are equal to each other in FIG. 1, but in the actual coil pattern 10, P1<P2<P3 as indicated in FIG. 1.

Although FIG. 1 illustrates the coil pattern 10 as having a polygonal shape, the coil pattern 10 may have various other shapes, such as a circular shape or a rectangular shape.

Figure 2:
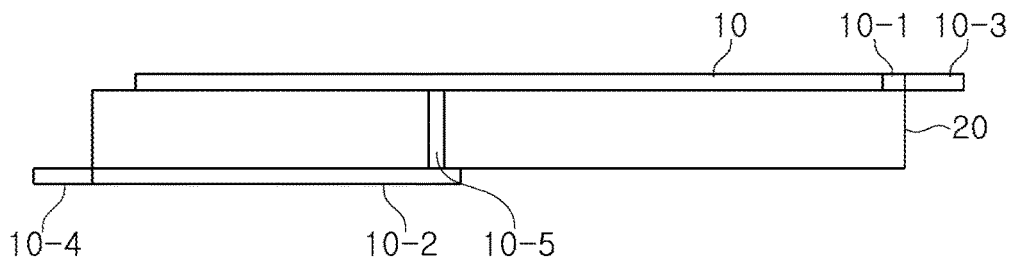
FIG. 2 is a schematic cross-sectional view of the inductor illustrated in FIG. 1.

FIG. 2 is a schematic cross-sectional view of the inductor illustrated in FIG. 1.

Referring to FIG. 2, the inductor illustrated in FIG. 1 is a thin-film inductor including a substrate 20 and the coil pattern 10 formed on one surface of the substrate 20. That is, the coil pattern 10 is formed as a conductive thin-film layer disposed on the substrate 20.

The coil pattern 10 is formed on one surface of the substrate 20, and an external end of the coil pattern 10 is electrically connected to a first external terminal 10-3 illustrated in FIG. 1 through a first connection pattern 10-1 illustrated in FIG. 1 formed on the one surface of the substrate 20.

The inductor further includes a second connection pattern 10-2 disposed on the other surface of the substrate 20 and electrically connected to an internal end of the coil pattern 10 through a via 10-5 passing through the substrate 20. The internal end of the coil pattern 10 is electrically connected to a second external terminal 10-4 through the second connection pattern 10-2.

Figure 3:
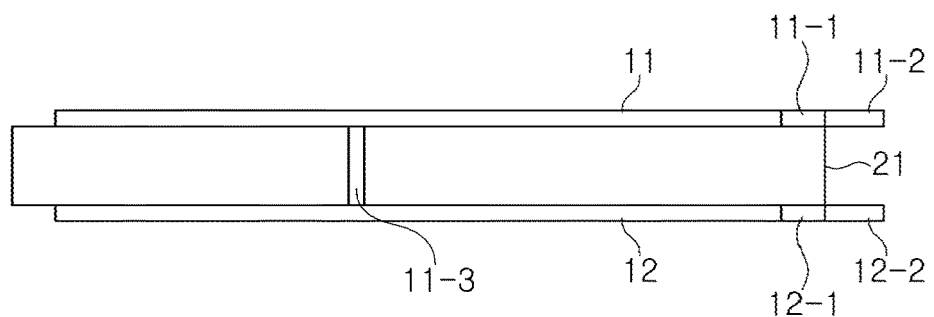
FIG. 3 is a schematic cross-sectional view of another example of an inductor in which a first coil pattern and a second coil pattern are connected to each other in series.

FIG. 3 is a schematic cross-sectional view of another example of an inductor in which a first coil pattern and a second coil pattern are connected to each other in series.

Referring to FIG. 3, an inductor includes a substrate 21, a first coil pattern 11 disposed on one surface of the substrate 21, and a second coil pattern 12 disposed on the other surface of the substrate 21.

The first coil pattern 11 and the second coil pattern 12 each have a spiral shape including a plurality of turns like the coil pattern 10 illustrated in FIG. 1. As the first coil pattern 11 extends inwardly towards a center of the first coil pattern 11, a pattern width (see W in FIG. 1) of the first coil pattern 11 decreases while a center-to-center distance (see P1, P2, P3 in FIG. 1) between two adjacent turns of the first coil pattern 11 increases (that is, P1<P2<P3). Likewise, as the second coil pattern 12 extends inwardly towards a center of the second coil pattern 12, a pattern width (see W in FIG. 1) of the second coil pattern 12 decreases while a center-to-center distance (see P1, P2, P3 in FIG. 1) between two adjacent turns of the second coil pattern 12 increases (that is, P1<P2<P3). For convenience of illustration, P1, P2, and P3 are equal to each other in FIG. 1, but in the actual coil patterns 11 and 12, P1<P2<P3 as indicated in FIG. 1.

The first coil pattern 11 and the second coil pattern 12 are connected to each other in series, thereby increasing a total inductance of the inductor.

The first coil pattern 11 and the second coil pattern 12 connected to each other in series have the same shape as the coil pattern 10 illustrated in FIG. 1. An internal end of the first coil pattern 11 and an internal end of the second coil pattern 12 are electrically connected to each other through a via 11-3 passing through the substrate 21. An external end of the first coil pattern 11 is connected to a first external terminal 11-2 through a first connection pattern 11-1 like the first connection pattern 10-1 illustrated in FIG. 1 disposed on the one surface of the substrate 21. An external end of the second coil pattern 12 is connected to a second external terminal 12-2 through a second connection pattern 12-1 like the first connection pattern 10-1 illustrated in FIG. 1 disposed on the other surface of the substrate 21.

Figure 4:
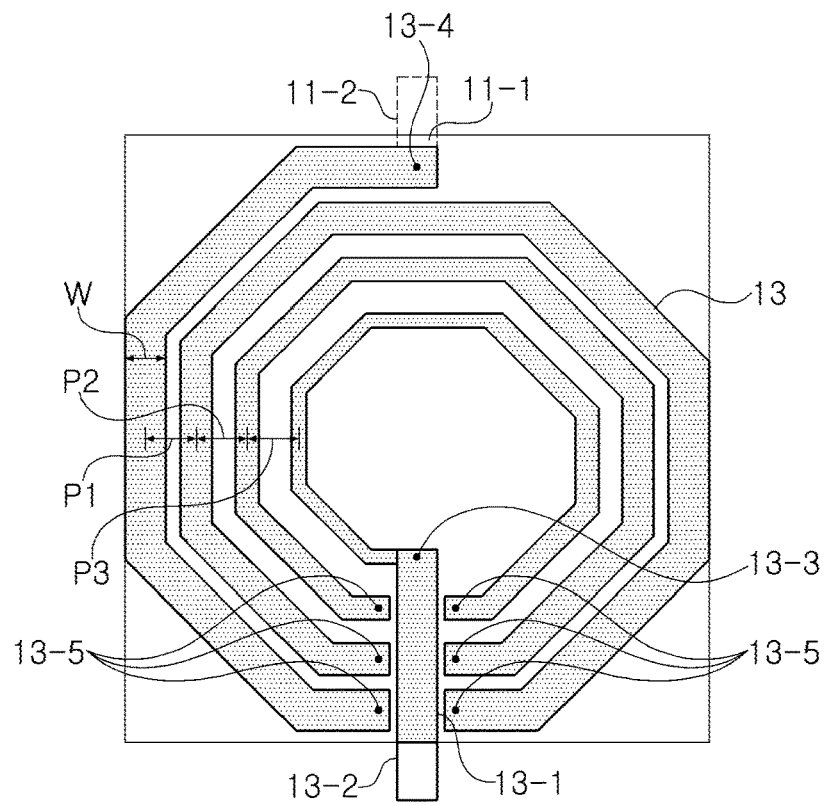
FIG. 4 is a schematic plan view illustrating another example of a second coil pattern in another example of an inductor in which a first coil pattern and a second coil pattern are connected to each other in parallel.

FIG. 4 is a schematic plan view of another example of a second coil pattern in another example of an inductor in which a first coil pattern and a second coil pattern are connected to each other in parallel.

Referring to FIG. 4, in another example of an inductor, a second coil pattern 13 disposed on the opposite surface of the substrate 21 of FIG. 3 replaces the second coil pattern 12 of FIG. 3, and the first coil pattern 11 of FIG. 3 disposed on the one surface of the substrate 21 and the second coil pattern 13 disposed on the opposite surface of the substrate 21 are connected to each other in parallel, thereby decreasing eddy currents in the inductor.

The first coil pattern 11 has the same shape as the coil pattern 10 illustrated in FIG. 1, and includes the first connection pattern 11-1 disposed on the one surface of the substrate 21 like the connection pattern 10-1 illustrated in FIG. 1.

The second coil pattern 13 has the same shape as the coil pattern 10 illustrated in FIG. 1, except that it does not include a connection pattern like the connection pattern 10-1 illustrated in FIG. 1, but includes a second connection pattern 13-1 disposed on the other surface of the substrate 21 that extends from an internal end of the second coil pattern 13 to an edge of the substrate 21. Since the second connection pattern 13-1 extends from the internal end of the second coil pattern 13 to the edge of the substrate 21, the turns of the second coil pattern 13 terminate adjacent to the second connection pattern 13-1 on opposite sides of the second connection pattern 13-1 as illustrated in FIG. 4.

The second coil pattern 13 has a spiral shape including a plurality of turns like the coil pattern 10 illustrated in FIG. 1. As the second coil pattern 13 extends inwardly towards a center of the second coil pattern 13, a pattern width W of the second coil pattern 13 decreases while a center-to-center distance (P1, P2, P3) between two adjacent turns of the second coil pattern 13 increases (that is, P1<P2<P3). For convenience of illustration, P1, P2, and P3 are equal to each other in FIG. 4, but in the actual coil pattern 14, P1<P2<P3 as indicated in FIG. 4.

An internal end of the first coil pattern 11 and the internal end of the second coil pattern 13 are electrically connected to each other through a first via 13-3 passing through the substrate 21, and an external end of the first coil pattern 11 and an external end of the second coil pattern 13 are electrically connected to each other through a second via 13-4 passing through the substrate 21.

The external end of the first coil pattern 11 is electrically connected to the first external terminal 11-2 through the first connection pattern 11-1 disposed on the one surface of the substrate 21, and the internal end of the second coil pattern 13 is connected to a second external terminal 13-2 through the second connection pattern 13-1 disposed on the other surface of the substrate 21. Alternatively, the first connection pattern 11-1 may be disposed on the other surface of the substrate 21, and the external end of the second coil pattern 13 may be connected to the first external terminal 11-2 through the first connection pattern 11-1.

The ends of the turns of the second coil pattern 13 on opposite sides of the second connection pattern 13-1 are connected to corresponding turns of the first coil pattern 11 through respective vias 13-5 extending through the substrate 21. Thus, the ends of the turns of the second coil pattern 13 on opposite sides of the second connection pattern 13-1 are connected to each other through the respective vias 13-5 and the corresponding turns of the first coil pattern 11.

Figure 5:
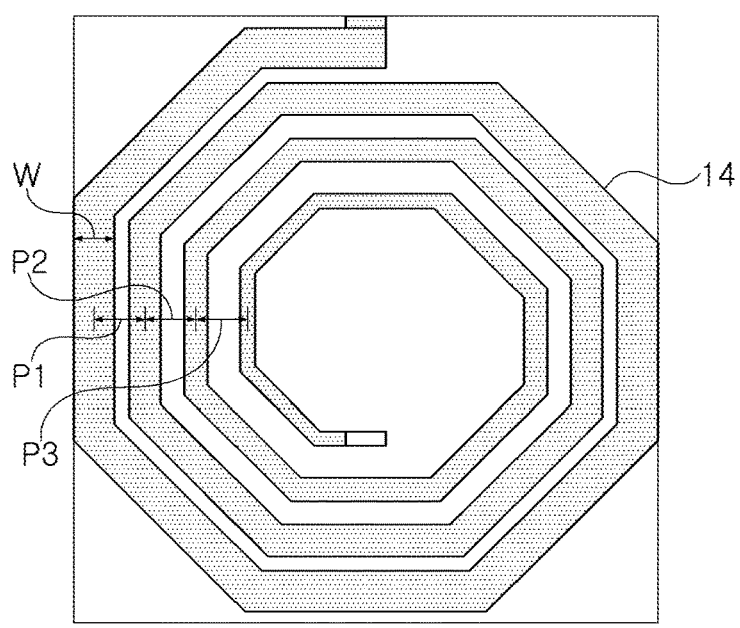
FIG. 5 is a schematic plan view illustrating a first comparative example of an inductor not according to the disclosure of this application.

FIG. 5 is a schematic plan view illustrating a first comparative example of an inductor not according to the disclosure of this application.

Referring to FIG. 5, a first comparative example of an inductor includes a coil pattern 14 having a spiral form including a plurality of turns, wherein as the coil pattern 14 extends inwardly towards a center of the coil pattern 14, a pattern width W of the coil pattern 14 decreases while a center-to-center distance (P1, P2, P3) between two adjacent turns of the coil pattern 14 remains constant (that is, P1=P2=P3).

The coil pattern 14 of the first comparative example illustrated in FIG. 5 may be formed by removing an inside portion and an outside portion of a coil pattern having a constant pattern width so that the pattern width W of the coil pattern 14 decreases as the coil pattern 14 extends inwardly towards the center of the coil pattern 14.

Figure 6:
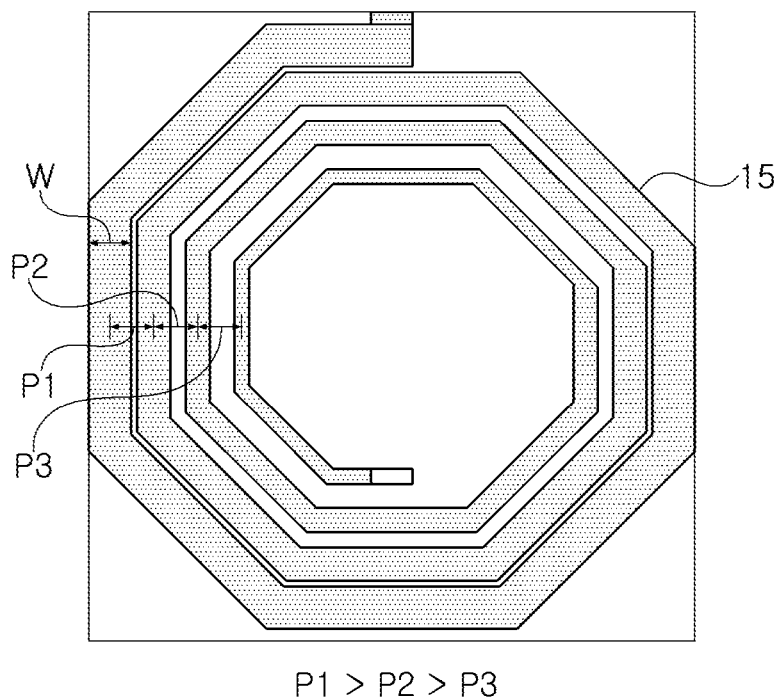
FIG. 6 is a schematic plan view illustrating a second comparative example of an inductor not according to the disclosure of this application.

FIG. 6 is a schematic plan view illustrating a second comparative example of an inductor not according to the disclosure of this application.

Referring to FIG. 6, a second comparative example of an inductor includes a coil pattern 15 having a spiral form including a plurality of turns, wherein as the coil pattern 15 extends inwardly towards a center of the coil pattern 15, a pattern width W of the coil pattern 15 decreases while a center-to-center distance (P1, P2, P3) between two adjacent turns of the coil pattern 15 decreases (that is, P1>P2>P3). For convenience of illustration, P1, P2, and P3 are equal to each other in FIG. 6, but in the actual coil pattern 15, P1>P2>P3 as indicated in FIG. 6.

The coil pattern 15 of the second comparative example illustrated in FIG. 6 may be formed by removing an inside portion of a coil pattern having a constant pattern width so that the pattern width W of the coil pattern 15 decreases as the coil pattern 15 extends inwardly towards the center of the coil pattern 15.

Figure 7:
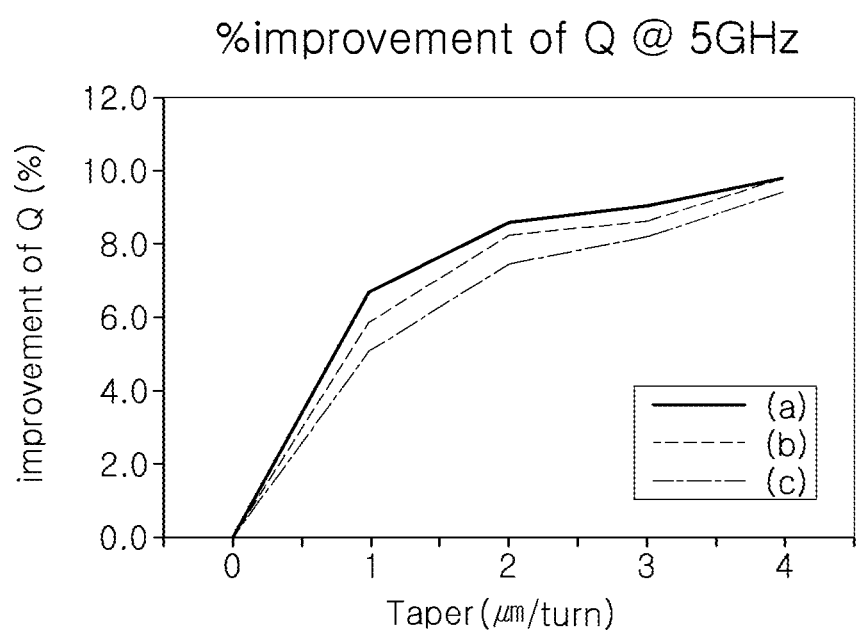
FIG. 7 illustrates improvements of quality factors of an example of an inductor according to the disclosure of this application, the first comparative example of an inductor illustrated in FIG. 5, and the second comparative example of an inductor illustrated in FIG. 6.

FIG. 7 illustrates improvements of Q factors of an example of an inductor according to the disclosure of this application, the first comparative example of an inductor illustrated in FIG. 5, and the second comparative example of an inductor illustrated in FIG. 6.

Curve (a) in FIG. 7 illustrates an improvement of a Q factor of an inductor according to the disclosure of this application, curve (b) in FIG. 7 illustrates an improvement of a Q factor of the first comparative example of an inductor illustrated in FIG. 5, and curve (c) in FIG. 7 illustrates an improvement of a Q factor of the second comparative example of an inductor illustrated in FIG. 6.

In FIG. 7, the X axis represents a taper of the pattern width of the coil pattern of the inductor measured in μm/turn. The taper is the amount by which the pattern width of the coil pattern changes in one turn of the coil pattern. Thus, the pattern widths at two points side by side on adjacent turns differ by the taper. The Y axis represents an improvement of the Q factor of the inductor measured in percent (%) at a frequency of 5 GHz as a function of the taper. The improvement of the Q factor is 0% when the taper is 0 μm/turn, i.e., when the pattern width is constant and does not change from turn to turn.

As can be seen from FIG. 7, the degree indicated by the curve (a) to which the Q factor of the inductor according to the disclosure of this application is improved is higher than the degree indicated by the curve (b) to which the Q factor of the first comparative example of an inductor illustrated in FIG. 5 is improved, and is also higher than the degree indicated by the curve (c) to which the Q factor of the second comparative example of an inductor illustrated in FIG. 6 is improved, regardless of the taper.

Figure 8:
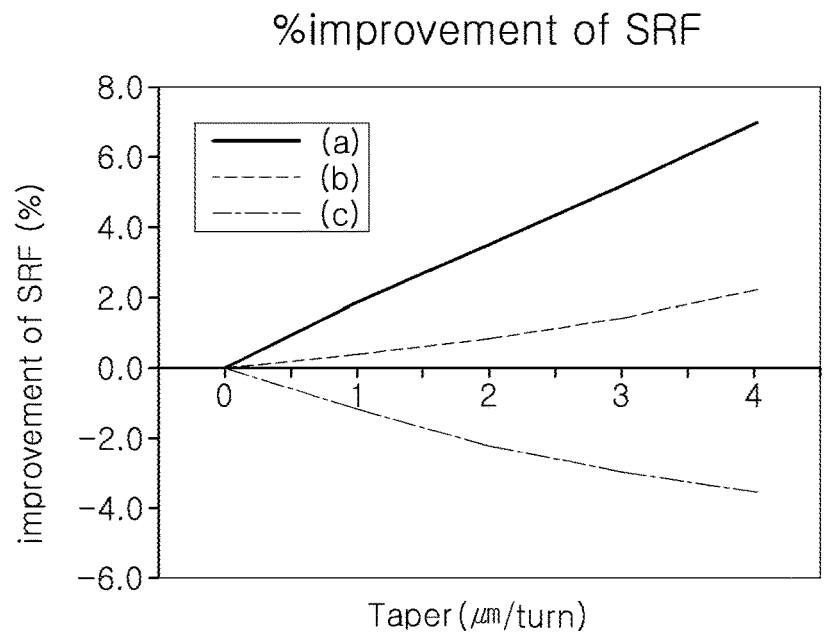
FIG. 8 illustrates improvements of self-resonant frequencies of an example of an inductor according to the disclosure of this application, the first comparative example of an inductor illustrated in FIG. 5, and the second comparative example of an inductor illustrated in FIG. 6.

FIG. 8 illustrates improvements of self-resonant frequencies (SRF) of an example of an inductor according to the disclosure of this application, the first comparative example of an inductor illustrated in FIG. 5, and the second comparative example of an inductor illustrated in FIG. 6.

Curve (a) in FIG. 8 shows an improvement of a self-resonant frequency of an example of an inductor according to the disclosure of this application, curve (b) in FIG. 8 shows an improvement of a self-resonant frequency of the first comparative example of an inductor illustrated in FIG. 5, and curve (c) in FIG. 8 shows an improvement of a self-resonant frequency of the second comparative example of an inductor illustrated in FIG. 6.

In FIG. 8, the X axis represents a taper of the pattern width of the coil pattern measured in μm/turn. The Y axis represents an improvement of the self-resonant frequency of the inductor measured in percent (%) as a function of the taper. The improvement of the self-resonant frequency is 0% when the taper is 0 μm/turn, i.e., when the pattern width is constant and does not change from turn to turn.

As can be seen from FIG. 8, the degree indicated by the curve (a) to which the self-resonant frequency of the inductor according to the disclosure of this application is improved is higher than the degree indicated by the curve (b) to which the self-resonant frequency of the first comparative example of an inductor illustrated in FIG. 5 is improved, and is also higher than the degree indicated by the curve (c) to which the self-resonant frequency of the second comparative example of an inductor illustrated in FIG. 6 is improved, regardless of the taper.

Figure 9:
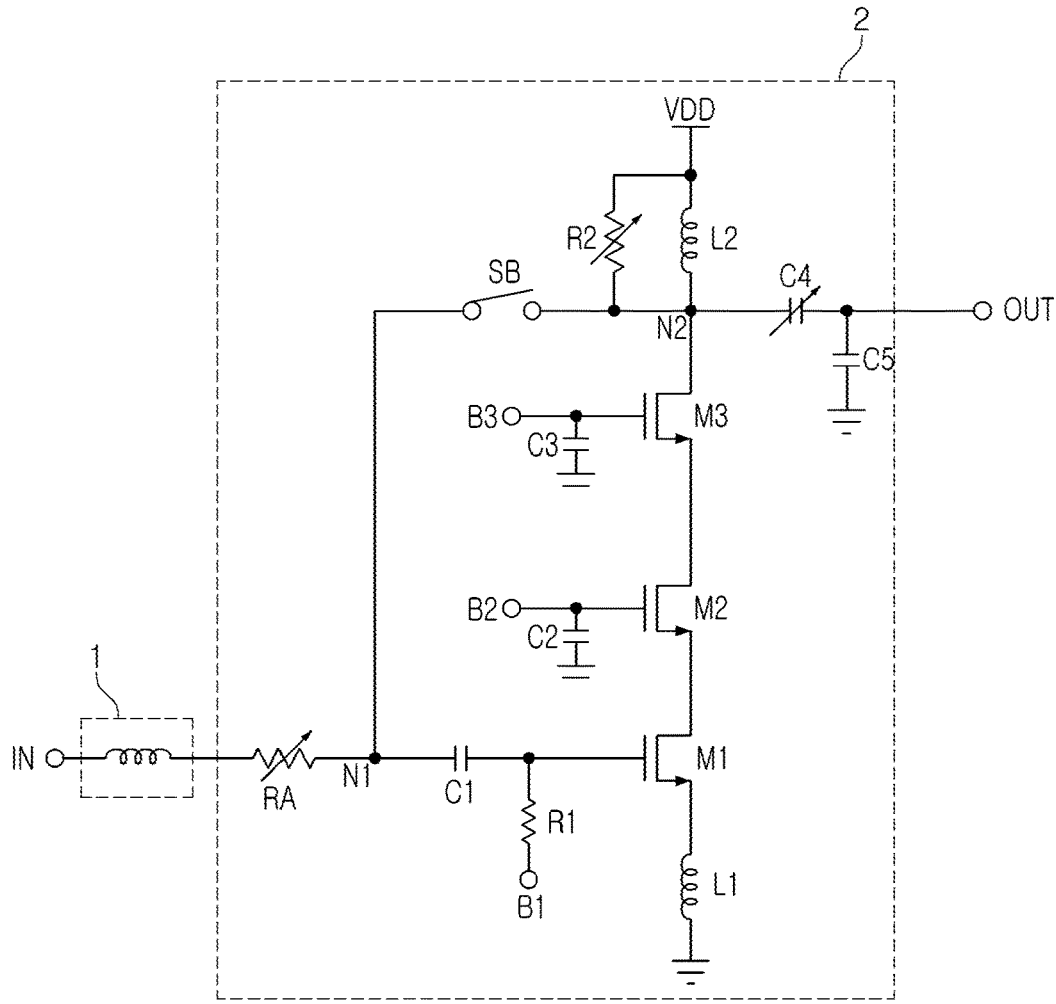
FIG. 9 schematically illustrates an example of a low-noise amplifier including an example of an inductor according to the disclosure of this application.

FIG. 9 is a schematic diagram of an example of a low-noise amplifier including an example of an inductor according to the disclosure of this application.

Referring to FIG. 9, a low-noise amplifier includes a matching inductor 1 and an amplifier circuit 2.

The low-noise amplifier may be implemented as a single integrated circuit (IC) including both the matching inductor 1 and the amplifier circuit 2, and may be used to receive a mobile signal in a mobile terminal.

The matching inductor 1 has the same configuration as one of the examples illustrated in FIG. 1 through FIG. 4, and is connected between an input port IN to which a signal is input and the amplifier circuit 2.

The amplifier circuit 2 includes a potentiometer RA connected between the matching inductor 1 and a first node N1, a first capacitor C1 having one end connected to the first node N1, a first resistor R1 connected between the other end of the capacitor C1 and a first bias terminal B1, a first inductor L1 having one end connected to a ground, a bypass switch SB connected between the first node N1 and a second node N2, a second resistor R2, which is a variable resistor, connected between a power supply voltage terminal VDD and the second node N2, a second inductor L2 connected between the power supply voltage terminal VDD and the second node N2, first to third transistors M1, M2, and M3 connected in series between the second node N2 and the other end of the first inductor L1, a second capacitor C2 connected between a gate of the second transistor M2 and the ground, a third capacitor C3 connected between a gate of the third transistor M3 and the ground, a fourth capacitor C4, which is a variable capacitor, connected between the second node N2 and an output terminal OUT, and a fifth capacitor C5 connected between the output terminal OUT and the ground. The gate of the second transistor M2 is connected to a second bias terminal B2, and the gate of the third transistor M3 is connected to a third bias terminal B3. The first transistor M1, the second transistor M2, and the third transistor M3 constitute a multi-stage amplifier that amplifies a signal input to the gate of the first transistor M1.

The examples of an inductor disclosed herein have a high quality factor and can be implemented in a silicon integrated circuit. The examples of an inductor disclosed herein may be used as an input matching element of a low-noise amplifier to reduce the noise figure of the low-noise amplifier. Since the examples of an inductor disclosed herein may be implemented in a silicon integrated circuit, they may be implemented as the input matching element in the same silicon integrated circuit as the low-noise amplifier, making it unnecessary to use an external input matching element with the low-noise amplifier, and thereby reducing the size and manufacturing cost of a module including the input matching elements and the low-noise amplifier.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An inductor comprising:
a substrate; and
a first coil pattern disposed on one surface of the substrate and having a spiral shape comprising a plurality of turns,
wherein as the first coil pattern extends inwardly towards a center of the first coil pattern, a pattern width of the first coil pattern decreases while a center-to-center distance between two adjacent turns of the first coil pattern increases, and
wherein the inductor further comprises:
a first connection pattern electrically connecting an external end of the first coil pattern to a first external terminal; and
a second connection pattern electrically connecting an internal end of the first coil pattern to a second external terminal.

2. The inductor of claim 1, wherein the inductor is a thin-film inductor configured for input matching in an integrated circuit.

3. The inductor of claim 1, further comprising a second coil pattern formed on another surface of the substrate.

4. The inductor of claim 3, wherein the second coil pattern has a spiral shape comprising a plurality of turns, and
as the second coil pattern extends inwardly towards a center of the second coil pattern, a pattern width of the second coil pattern decreases while a center-to-center distance between two adjacent turns of the second coil pattern increases.

5. The inductor of claim 3, wherein the first coil pattern and the second coil pattern are connected to each other in series.

6. The inductor of claim 3, wherein the first coil pattern and the second coil pattern are connected to each other in parallel.

7. An inductor comprising:
a substrate;
a first coil pattern disposed on one surface of the substrate and having a spiral shape comprising a plurality of turns; and
a second coil pattern formed on another surface of the substrate,
wherein as the first coil pattern extends inwardly towards a center of the first coil pattern, a pattern width of the first coil pattern decreases while a center-to-center distance between two adjacent turns of the first coil pattern increases,
wherein the first coil pattern and the second coil pattern are connected to each other in parallel,
wherein the inductor further comprises:
a first via passing through the substrate;
a second via passing through the substrate;
a first connection pattern disposed on the one surface of the substrate; and
a second connection pattern disposed on the other surface of the substrate,
wherein an external end of the first coil pattern and an external end of the second coil pattern are electrically connected to each other through the first via,
an internal end of the first coil pattern and an internal end of the second coil pattern are electrically connected to each other through the second via,
the external end of the first coil pattern is electrically connected to a first external terminal through the first connection pattern, and
the internal end of the second coil pattern is electrically connected to a second external terminal through the second connection pattern.

8. The inductor of claim 7, wherein turns of the second coil pattern terminate adjacent to the second connection pattern on opposite sides of the second connection pattern, and
the inductor further comprises vias extending through the substrate and connecting respective ends of the turns of the second coil pattern on opposite sides of the second connection pattern to corresponding turns of the first coil pattern so that the ends of the turns of the second coil pattern on opposite sides of the second connection pattern are electrically connected to each other through respective ones of the vias and the corresponding turns of the first coil pattern.

9. A low-noise amplifier comprising:
a matching inductor comprising a coil pattern, wherein one end of the matching inductor is connected to an input terminal, and as the coil pattern extends inwardly towards a center of the coil pattern, a pattern width of the coil pattern decreases while a center-to-center distance between two adjacent turns of the coil pattern increases; and
an amplifier circuit configured to amplify an input signal output from another end of the matching inductor and output the amplified input signal to an output terminal,
wherein the low-noise amplifier is implemented as a single integrated circuit including the matching inductor and the amplifier circuit, and
wherein the amplifier circuit comprises:
a potentiometer connected between the matching inductor and a first node;
a first capacitor having one end connected to the first rode;
a first resistor connected between another end of the first capacitor and a first bias terminal;
an amplifier configured to amplify a signal output from the other end of the first capacitor and output the amplified signal to a second node;
a first inductor connected between the amplifier and a ground;
a second inductor connected between a power supply voltage terminal and the second node;
a second capacitor connected between the second node and the output terminal; and
a third capacitor connected between the output terminal and the ground.

10. The low-noise amplifier of claim 9, wherein the amplifier circuit further comprises a bypass switch connected between the first node and the second node.

* * * * *